United States Patent [19]

Bois et al.

[11] Patent Number: 4,818,306

[45] Date of Patent: Apr. 4, 1989

[54] MONOCRYSTALLINE ALLOY WITH A NICKEL BASE MATRIX

[75] Inventors: Françoise J. Bois, Cesson; Luc G. Remy, Paris; Jean-Marc C. Theret, Evry, all of France

[73] Assignees: Societé Nationale d'Etude et de Construction de Moteurs d'Aviation "S.N.E.C.M.A."; Association pour la Recherche et le developpment des Methodes et Processus Industriels "ARMINES", both of Paris, France

[21] Appl. No.: 832,351

[22] Filed: Feb. 24, 1986

[30] Foreign Application Priority Data

Mar. 6, 1985 [FR] France .............................. 85 03267

[51] Int. Cl.⁴ .............................. C22C 19/05
[52] U.S. Cl. .................................. 148/404; 148/162; 148/410
[58] Field of Search ............... 148/404, 410, 428, 162; 420/445

[56] References Cited

FOREIGN PATENT DOCUMENTS 0063511 10/1982 European Pat. Off. .
0076360 4/1983 European Pat. Off. .
2007572 1/1970 France .
2371516 6/1978 France .
2557598 7/1985 France .
1087051 10/1967 United Kingdom .
1106087 3/1968 United Kingdom .
2071695 9/1981 United Kingdom .

Primary Examiner—R. Dean
Attorney, Agent, or Firm—Oblon, Fisher, Spivak, McClelland & Maier

[57] ABSTRACT

Monocrystalline alloy with a nickel base matrix without intentional addition of carbon, of boron or of zirconium, having a composition by weight: Co 0 to 10% - Cr 5 to 7% - Mo 1.5 to 2.5% - W 8.5 to 12.5% - Ta 0 to 6.5% - Al 5 to 7% - Nb 0 to 2% - Ni balance to 100. Furthermore, the summation of the atomic percentages 0.005 Xo+0.036 Cr+0.052 Mo+0.066 W+0.026 Al+0.116 Nb +0.049 Ta is less than one and the summation of the atomic percentages Ta+W+Mo+Nb lies between 5.9 and 6.3. The alloys having an elevated solidus temperature, in excess of 1325° C., are particularly adapted to monocrystalline casting of the vanes of the turbine inlet nozzle array and having significantly improved properties of strength under conditions of thermal fatigue and oligocyclic fatigue.

6 Claims, 4 Drawing Sheets

MONOCRYSTALLINE ALLOY WITH A NICKEL BASE MATRIX

FIELD OF THE INVENTION

The invention relates to monocrystalline alloys with a matrix having a nickel base, without the intentional addition of carbon, or boron or of zirconium.

SUMMARY OF THE PRIOR ART

Such alloys are known for example from FR-A-2 557 598 or from European published application EP-A-0063511.

The object of the invention is to provide a novel group of alloys of the type set forth, suitable for monocrystalline casting, having an elevated solidus temperature (that is in excess of 1325° C.) while at the same time maintaining a practicable thermal treatment spacing between the solidus temperatures and of the gamma-prime solvus phase; Such alloys have, moreover, useful mechanical properties in relation to fatigue strength which render them particularly suitable for use in the aeronautical field, more particularly in the manufacture of the inlet guide nozzle vanes of a turbine.

SUMMARY OF THE INVENTION

This object is achieved in accordance with the invention by alloys having the following composition by weight:

|    |              |    |                  |
|----|--------------|----|------------------|
| Co | 0 to 10%     | Ta | 0 to 6.5%        |
| Cr | 5 to 7%      | Al | 5 to 7%          |
| Mo | 1.5 to 2.5%  | Nb | to 2%            |
| W  | 8.5 to 12.5% | Ni | balance to 100   | with, in addition the summation of the atomic percentages: $0.005Co + 0.036Cr + 0.052Mo + 0.066W + 0.026Al + 0.116Nb + 0.049Ta$ less than or equal to 1, these alloys having no titanium.

In order to enable a comparison with other groups of alloys containing, in particular, titanium, the relationship hereinbefore referred to must be applied by applying to the atomic percentage of titanium a multiplying coefficient of 0.078.

DESCRIPTION OF THE PREFERRED EMBODIMENT

The introduction of tungsten to an alloy of the kind in question contributes to the stability of the gamma-phrase. It is preferable to maintain the atomic sum $Ta+W+Mo+Nb$ between 5.9 and 6.3 in order to avoid precipitation of a massive primary phase.

The addition of cobalt does not change the temperatures of the liquidus and of the solidus but reduces the temperature of the gamma-prime solvus; cobalt increases the window for return to solution to the gamma-prima phase which facilitates the carrying out of thermal treatment.

Figure 1:
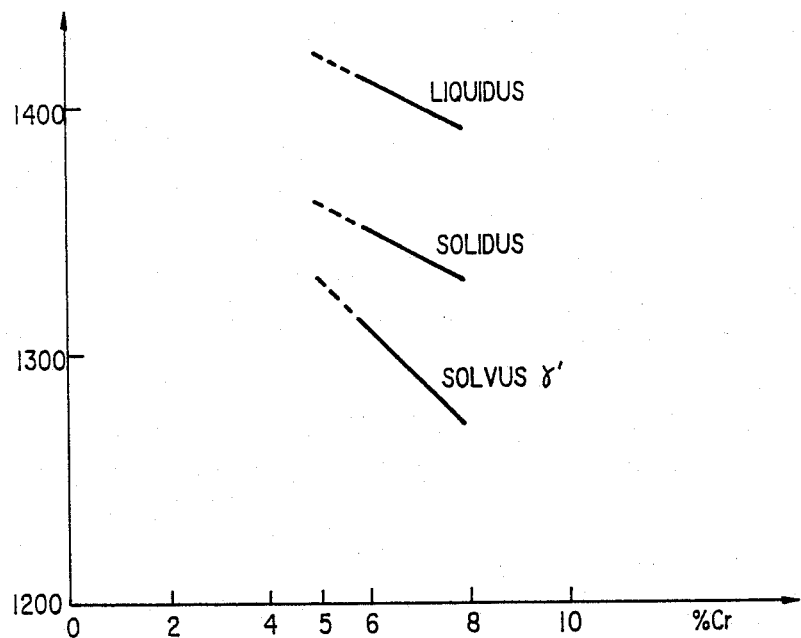
FIG. 1 is a graph showing the effect of the amount of chromium (percentage by weight indicated as the abscissa) on the temperatures (shown as the ordinate) of the liquidus, of the solidus and of the gamma-prime solvus.

The increase in the amount of chromium up to 8% by weight reduces the temperatures of the liquidus, of the solidus and of the gamma-prime solvus (compare FIG. 1) and may give rise to the production of a primary phase.

With regard to the distribution of elements generating gamma-prime phase, the addition of aluminium is preferred to titanium in order to take into account the effect of the reduction of the temperature of the solidus of the alloy since the effect of aluminium is appreciably less than that of titanium. In the relation defined above between the atomic compositions for example, the representative coefficient for titanium of this influence is of the order of three times greater than that of aluminium. For this reason, alloys in accordance with the invention are free of titanium.

Figure 2:
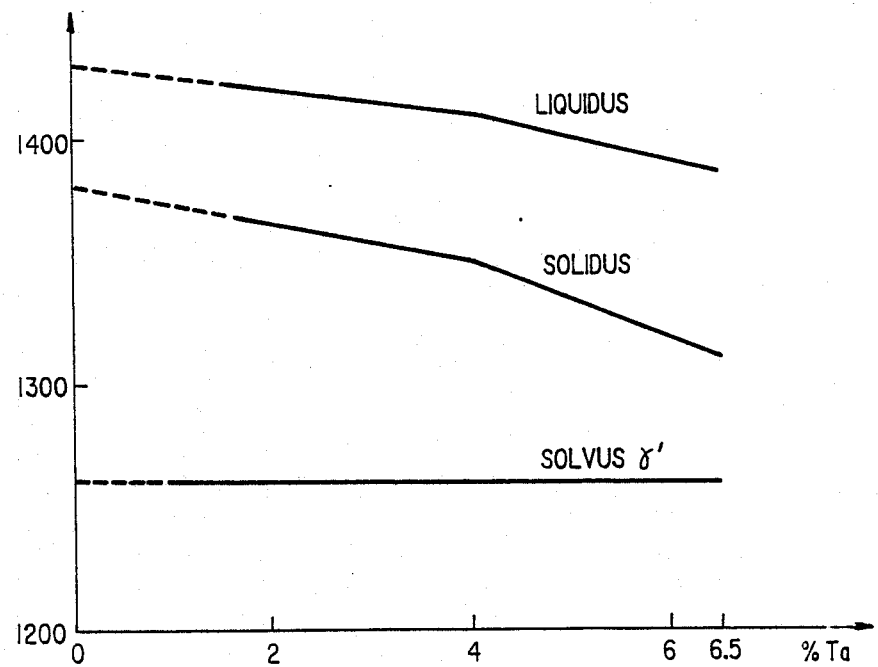
FIG. 2 is a similar graph to that of FIG. 1 but is related to the effect of the amount of tantalum.

The addition of tantalum, the other elements remaining constant, reduces the temperatures of the liquidus and of the solvus, without substantially modifying temperature of the gamma-prime solvus. FIG. 2 has been prepared on the basis of an amount by weight of tungsten of 11%. The substitution of niobium (likewise serving to generate gamma-prime phase) by tantalum is of interest in as far as the solidus temperature increases from 15° to 20° C. However, it is preferable to maintain the amount by weight of tantalum less than or equal to 6.5% in order to avoid substantial fall in the temperature of the solidus. This critical amount of tantalum is a function of the amount of tungsten and thus for an amount by weight of the tungsten of 11, this critical amount must be reduced to 5.5 (compare FIG. 2). The amount of molybdenum, a softening element, is intended to confer an improved strength to the matrix of nickel where it gives rise to a preferential segregation.

By way of example, three alloys N1, B, F in accordance with the invention have been particularly carefully studied. Their composition is given in Table 1, hereinafter, where the amounts are expressed as a percentage by weight and an atomic percentage (between parentheses). The temperatures of the liquidus, solidus and gamma-prime solvus for the alloys in accordance with the invention are set out in Table 2 hereinafter, where they are compared with those which related to commercial monocrystalline alloys Mar M200, CMSX2, SRR99.

Alloys in accordance with the invention, produced in monocrystalline form, are subjected to a sequence of thermal treatments which are appropriate to optimise their properties.

The thermal treatment is initiated by putting into solution gamma-prime precipitates. This is carried out at a temperature lower than the temperature of the solidus between 1300° C. and 1320° C. for a period of one to three hours and for example 1300° C. for one hour for the alloy N1. The cooling is carried out by air hardening, the amount of the gamma-prime precipitates is 0.3μm.

Two further treatments at 1100° C. for three hours to ten hours and at 850° C. for fifteen hours to twenty five hours enable the precipitation of the gamma-prime phase (the amount of gamma-prime precipitates obtained after complete treatment of the alloy N1 is 0.4μm).

Figure 3:
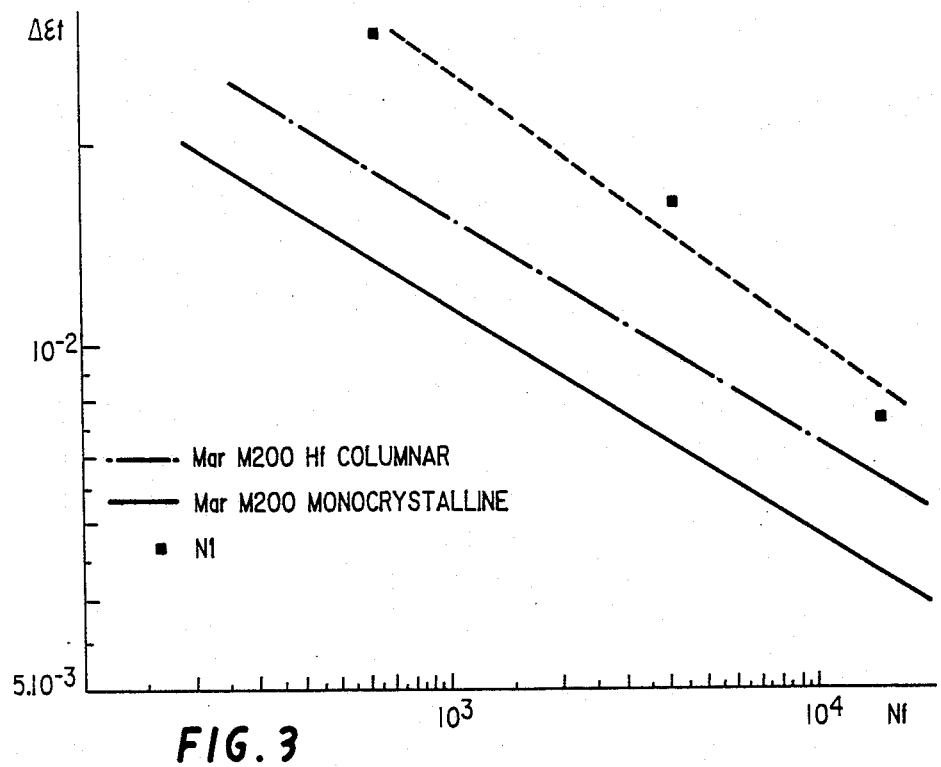
FIG. 3 illustrates the endurance curve of the Manson Coffin at 900° C. for an alloy in accordance with the invention and two commercial alloys MarM200 Hf with a columnar structure and MarM200 with a monocrystalline structure. The amplitude of the total deformation $\Delta\epsilon T$ is indicated as ordinate as a function of the number of cycles to rupture Nf indicated as abscissa.
Figure 4:
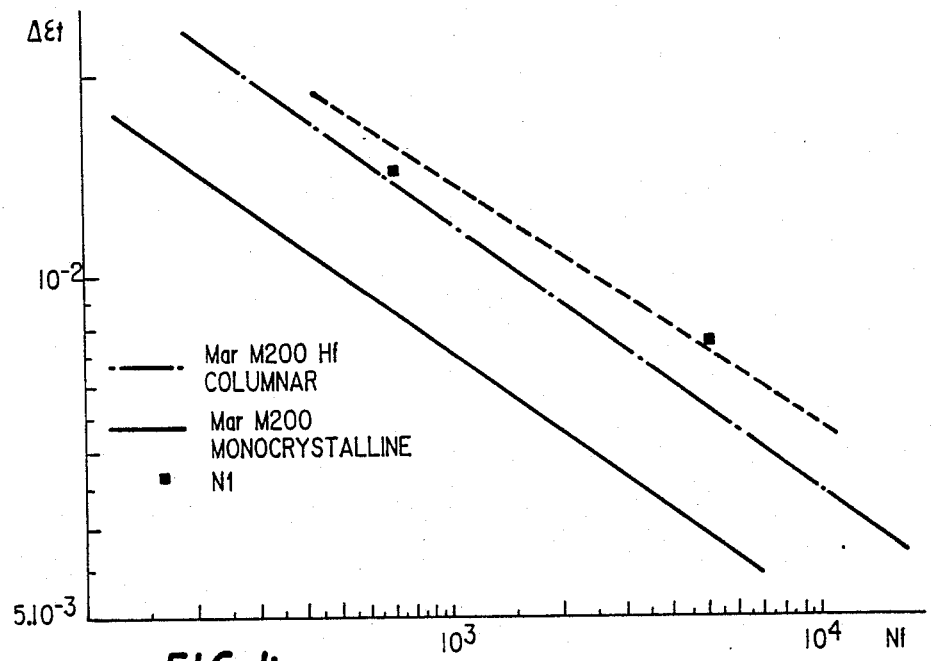
FIG. 4 illustrates a similar curve to that of FIG. 3 but applied to a temperature of 1000° C.
Figure 3A:
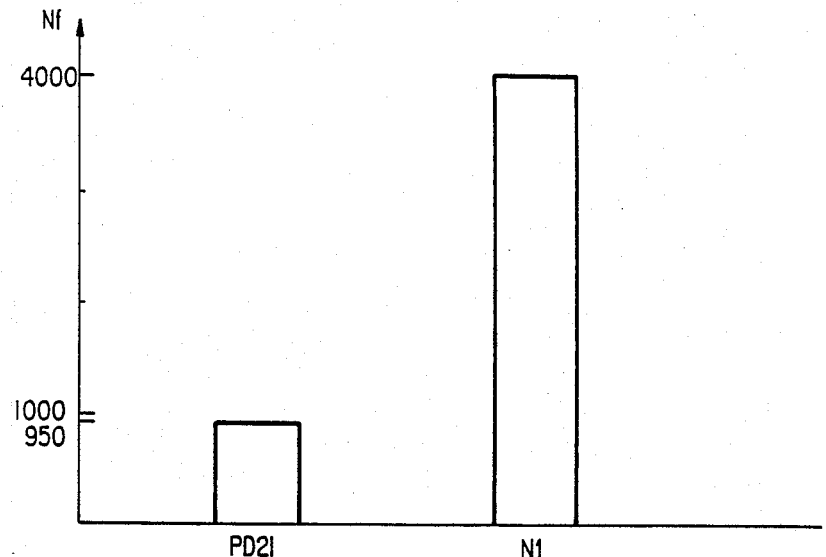
FIG. 3a illustrates the results of a test similar to those of FIGS. 3 for an alloy in accordance with the invention and another commercial alloy PD21 with a total imposed deformation $\Delta\epsilon T$ of 1.2%. The number of cycles to rupture Nf is indicated as ordinate.
Figure 5:
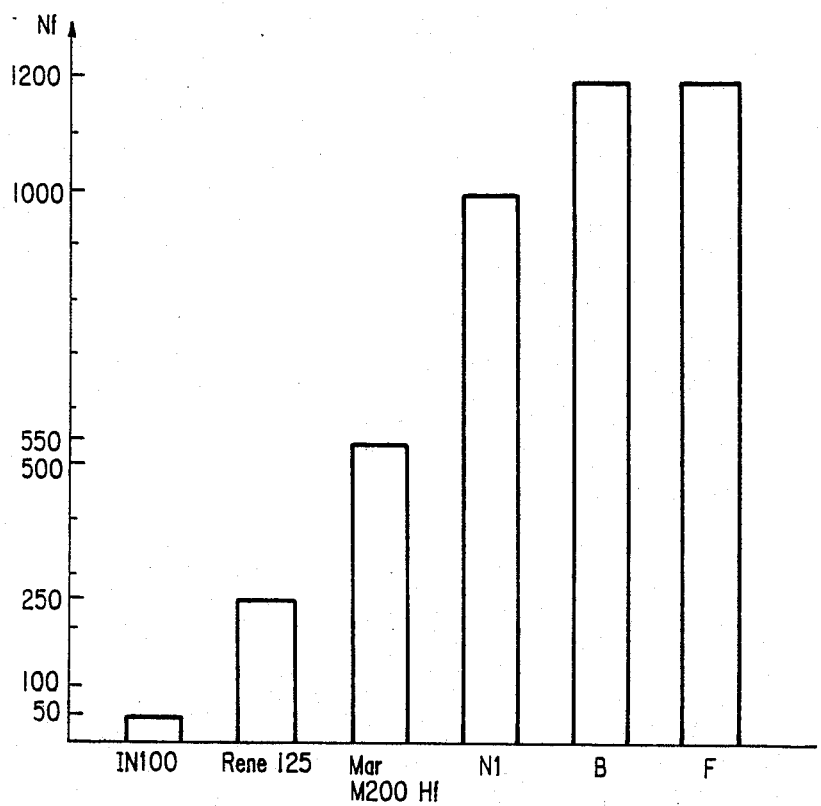
FIG. 5 compares alloys in accordance with the invention with three commercial alloys IN100 with equiaxial structure, Rene 125 with a columnar structure and Mar M200 with a columnar structure, in relation to thermal fatigue, the number of cycles before cracking being indicated as ordinate.

The alloy N1 has been tested for oligocyclic fatigue (total imposed deformation) at 900° C. and 1000° C. (FIGS. 3 and 4). It appeared that at 900° C. the alloy had a life expectancy five times greater than that of MARM 200Hf with a known columnar structure in order to provide for good properties during oligocyclic fatigue at high temperature and thermal fatigue. FIG. 3 also illustrates the comparative results for oligocyclic fatigue at 900° C. with a total imposed deformation of 1.2% showing the superiority of the alloy according to the invention N1 with respect to another known alloy having the commercial designation PD21 corresponding to Example 3 of U.S. Pat. No. 4,174,964.

These tests were conducted on test pieces which were treated but in the uncovered condition.

The thermal fatigue tests were effected in the flame zone having a maximum temperature of 1100° C. FIG. 3 brings together the results obtained for the alloys N1, B, F, in accordance with the invention and of other alloys with a columnar structure (MAR M 200 Hf, René 125) or equiaxial IN 100 and shows the superiority of alloys in accordance with the invention in which cracks and other faults appear beyond 1000 cycles.

Figure 6:
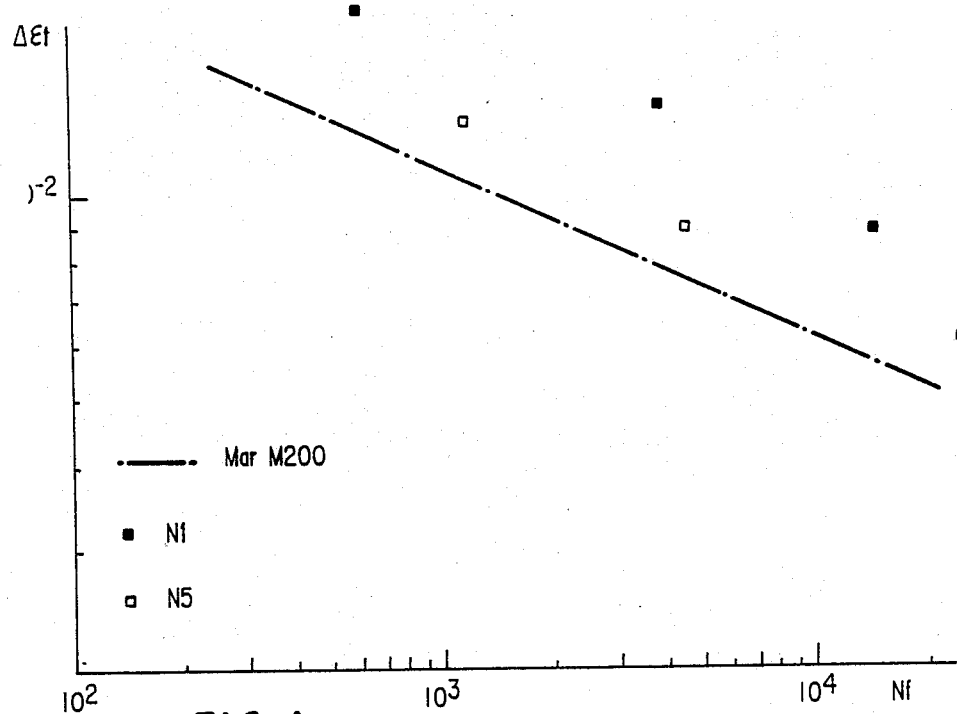
FIGS. 6 and 7 compare respectively at 900° and 1000° C., an alloy in accordance with the invention, an alloy close to the invention and a commercial alloy Mar M 200 with a monocrystalline structure, in relation to the oligocyclic fatigue with imposed deformation. The duration of the life Nf is indicated as abscissa as a function of the total imposed deformation $\Delta\epsilon T$ indicated as ordinate.
Figure 7:
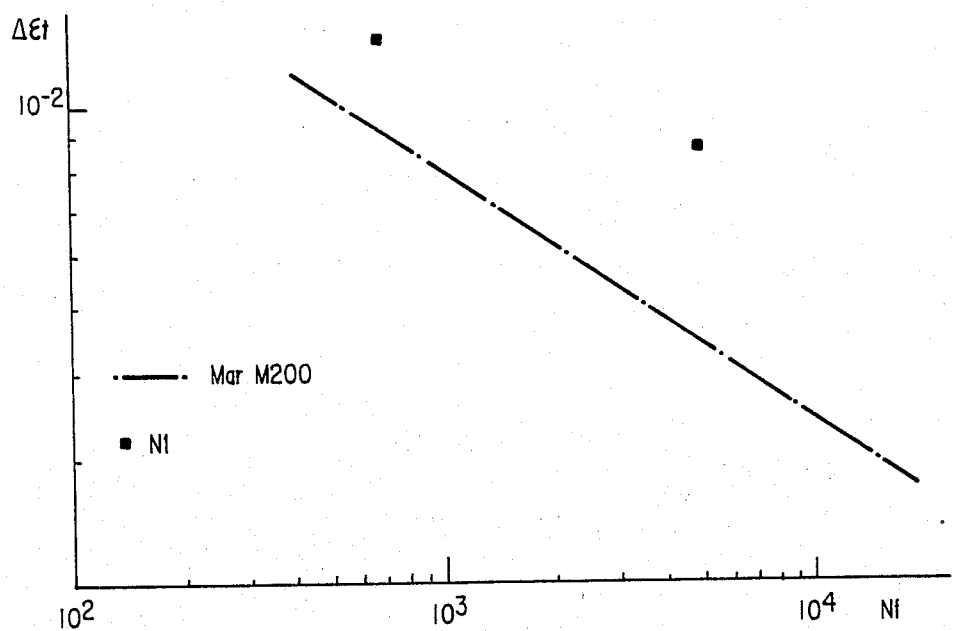

FIGS. 6 and 7 relate to oligocyclic fatigue tests with an effective imposed deformation at 900° and 1000° C. At the two temperatures, MarM200 with a monocrystalline structure served as the reference. The curves give numbers of cycles to rupture as a function of the total imposed deformation. At 900° C. an alloy N5 was also tested which is approaching in composition the group of alloys in accordance with the invention, but not included within the ranges:

| Alloy | Ni | Cr | Mo | W | Ta | Al |
|---|---|---|---|---|---|---|
| N5 | Base | 7.5 | 2 | 11 | 4 | 6 |

The characteristics obtained are inferior to those of the reference N1 belonging to the group of alloys in accordance with the invention.

The series of tests carried out by the applicants illustrate that the alloys of the group in accordance with the invention have improved properties to a significant extent in particular having regard to thermal fatigue and the strength during oligocyclic fatigue, while at the same time having, as has been shown by research, an elevated solidus.

TABLE 1

|  | N1 | | B | | F | |
|---|---|---|---|---|---|---|
|  | % by wt. | % atom | % by wt. | % atom | % by wt. | % atom |
| Co | 0 | (0) | 5 | (5.14) | 5 | (5.14) |
| Cr | 6 | (6.85) | 6 | (6.99) | 6 | (6.99) |
| Mo | 2 | (1.24) | 2 | (1.26) | 2 | (1.26) |
| Al | 6 | (13.2) | 6 | (13.48) | 6 | (13.48) |
| W | 11 | (3.55) | 11 | (3.62) | 9 | (2.96) |
| Nb | 1.8 | (1.15) | 0 | (0) | 0 | (0) |
| Ta | 0 | (0) | 4 | (1.34) | 6 | (2.01) |
| Ni | balance | | balance | | balance | |

TABLE 2

| Alloy | Temperature liquidus(°C.) | Temperature solidus(°C.) | Temperature solvus gamma-prime(°C.) |
|---|---|---|---|
| N1 | 1398 | 1330 | 1270 |
| B | 1408 | 1350 | 1282 |
| F | 1390 | 1340 | 1295 |
| Mar M200 | 1350 | 1240 | 1200 |
| CMS X 2 | 1375 | 1325 | 1265 |
| SRR 99 | 1370 | 1305 | 1260 |

What is claimed is:

1. Monocrystalline alloys with a nickel base matrix, without intentional addition of carbon, of boron or of zirconium, consisting essentially of a composition by weight as follows:

| Co | 0 to 10% |
|---|---|
| Cr | 5 to 7% |
| Mo | 1.5 to 2.5% |
| W | 8.5 to 12.5% |
| Ta | 0 to 6.5% |
| Al | 5 to 7% |
| Nb | 0 to 2% |
| Ni | balance to 100% | with, in addition, a summation of atomic percentages: 0.005Co+0.036Cr+0.052Mo+0.066W+0.026Al+0.116Nb+0.049Ta less than or equal to one, and a summation of atomic percentages: Ta+W+Mo+Nb between 5.9 and 6.3, the alloys being free of titanium.

2. An alloy according to claim 1, having the following composition by weight:

| Co | 0 |
|---|---|
| Cr | 6 |
| Mo | 2 |
| Al | 6 |
| W | 11 |
| Nb | 1,8 |
| Ta | 0 |
| Ni | balance. |

3. An alloy according to claim 1 having the following composition by weight:

| Co | 5 |
|---|---|
| Cr | 6 |
| Mo | 2 |
| Al | 6 |
| W | 11 |
| Nb | 0 |
| Ta | 4 |

| -continued | |
|---|---|
| Ni | balance. |

4. An alloy according to claim 1 having the following composition by weight:

| | |
|---|---|
| Co | 5 |
| Cr | 6 |
| Mo | 2 |
| Al | 6 |
| W | 9 |
| Nb | 0 |
| Ta | 6 |

| -continued | |
|---|---|
| Ni | balance. |

5. An alloy according to claim 1 wherein the alloy is subjected to a high temperature thermal treatment to bring into total solution the gama-prime phase, followed by hardening to precipitate the gamma-prime phase, followed by two re-heats.

6. An alloy according to claim 5 wherein the treatment for putting into solution the gamma-prime phase is effected between 1300° C. and 1320° C. for a period of 1 hour to 3 hours, and the two re-heats are effected up to 1100° C. for 3 to 10 hours and at 850° C. for 15 to 25 hours.

* * * * *

UNITED STATES PATENT AND TRADEMARK OFFICE
CERTIFICATE OF CORRECTION

PATENT NO. : 4,818,306

DATED : April 4, 1989

INVENTOR(S) : FRANCOISE J. BOIS, ET AL

It is certified that error appears in the above-identified patent and that said Letters Patent is hereby corrected as shown below:

Column 1, line 21, "Such" should read --such--.

Column 2, lines 9 and 10, "Mar M 200" should read --MarM200-- line 58, "weight of the tungsten" should read --weight of tungsten--.

Column 3, line 4, "Mar M200" should read --MarM200-- line 28, "MARM 200Hf" should read --MarM200 Hf-- line 43, "MAR M 200 Hf" should read --MarM200 Hf--.

Column 4, line 24, "Mar M200" should read --MarM200--, and "CMS X 2" should read --CMSX2-- line 25, "SRR 99" should read --SRR99--.

UNITED STATES PATENT AND TRADEMARK OFFICE
CERTIFICATE OF CORRECTION

PATENT NO. : 4,818,306

DATED : April 4, 1989

INVENTOR(S) : Francoise J. Bois, et al

It is certified that error appears in the above-identified patent and that said Letters Patent is hereby corrected as shown below:

In the drawings "Mar M200" should be --MarM200 --.

Signed and Sealed this

Thirty-first Day of July, 1990

Attest:

HARRY F. MANBECK, JR.

*Attesting Officer*    *Commissioner of Patents and Trademarks*